United States Patent [19]

Goodnough

[11] Patent Number: 4,567,363
[45] Date of Patent: Jan. 28, 1986

[54] SWITCHED CAPACITOR TRANSRESISTANCE AMPLIFIER

[75] Inventor: Mark A. Goodnough, Goleta, Calif.

[73] Assignee: Santa Barbara Research Center, Goleta, Calif.

[21] Appl. No.: 505,633

[22] Filed: Jun. 20, 1983

[51] Int. Cl.[4] .............................................. H01J 40/14
[52] U.S. Cl. ..................................... 250/214 A; 330/9
[58] Field of Search ............... 250/214 R, 214 A, 206, 250/208, 209; 330/9, 107, 277

[56] References Cited

U.S. PATENT DOCUMENTS

| | | | |
|---|---|---|---|
| 3,801,933 | 4/1974 | Teare | 250/214 A |
| 3,836,862 | 9/1974 | Seely et al. | 330/277 |
| 3,988,689 | 10/1976 | Ochi et al. | 330/9 |
| 4,068,182 | 1/1978 | Dingwall et al. | 330/9 |
| 4,100,407 | 7/1978 | Takahshi | 250/206 |
| 4,255,715 | 3/1981 | Cooperman | 330/9 |

Primary Examiner—David C. Nelms
Assistant Examiner—J. Gatto
Attorney, Agent, or Firm—Ronald L. Taylor; Mark J. Meltzer; A. W. Karambelas

[57] ABSTRACT

A transresistance amplifier particularly adapted for use in a radiation detection system. The amplifier includes a feedback gain stage with a switched capacitor load. The amplifier is arranged to provide an average detector voltage approximating zero thus substantially reducing detector noise and also providing a low equivalent input impedance for increasing injection efficiency. A switched capacitor output load is also provided which allows the total transresistance to be determined by simply selecting an appropriate capacitance value.

9 Claims, 11 Drawing Figures

SWITCHED CAPACITOR TRANSRESISTANCE AMPLIFIER

BACKGROUND OF THE INVENTION

1. Field of the Invention

The invention relates to electronic amplifiers and, in particular, to a transresistance amplifier having a gain stage in its feedback path and a switched capacitor load, the tranresistance amplifier being particularly adapted for use in a radiation detection system.

2. Description of the Prior Art

The continuing goal of microelectronic designers is to increase the number of microelectronic circuits formed on a semiconductor chip of decreasing size, the circuits and their interconnections being manufactured simultaneously. A concurrent goal is to reduce the power dissipation of the chip.

In many types of signal processing systems, such as monolithic infrared focal plane signal processing systems used in space detection applications, for example, it is required that each component in the system be designed to optimize overall performance while reducing system power dissipation. In the above mentioned system, the signal processing chip is intended to process the output of a plurality of independent photovoltaic infrared detectors. The output of each detector is an electric current which must be converted into a voltage by a transresistance amplifier connected thereto, the voltage output of the amplifier being applied to a high pass filter to remove signal information from stationary background sources. The output of the filter is coupled to external circuitry via a multiplexer and buffer. The design of the transresistance amplifier in this system is thus based in part on the characteristics of the detector and filter. Regarding the photovoltaic detector, detector current is related to the incident light flux, the voltage bias across the detector and, to a lesser extent, the reverse saturation current.

In order to reduce detector noise, it is necessary to operate the detector with low (ideally zero) bias voltage. Operating the detector into a short circuit load would satisfy this requirement, the standard solution to such a problem being to use an operational amplifier as the load. However, this is difficult to achieve in practice because the available chip area in this application is limited and is unable to support an operational amplifier. Further, even if an operational amplifier could be utilized, it dissipates relatively large amounts of power. Therefore, it is desired to find a solution which permits the detector to be operated at a relatively low voltage level which remains essentially constant for a large variation in light flux while at the same time minimizing power dissipation and required chip area.

Other constraints placed on the design of the transresistance amplifier in addition to those due to the characteristics of the filter and detector include temperature (infrared detection applications require that the amplifier be in an extremely cool environment, (e.g., 77° K.), dynamic range, actual transresistance, injection efficiency, and the type of active device (i.e., pMOS or nMOS) which can be used. Transresistance is a measure of the amount of AC output voltage generated for a given amount of AC input current, while injection efficiency is a measure of the amount of AC current provided to the detector load circuitry for a given amount of AC detector current.

A number of solutions have been proposed to provide a tranresistance amplifier which meets the above constraints. One such solution utilizes a gain stage in the gate electrode of a MOSFET transresistance amplifier, a second MOSFET with a resistive load being used as the gain stage. Although noise is reduced, the power dissipation due to the resistance load is relatively high, especially when considered in light of the relatively small improvement in injection efficiency provided by this arrangement. Another solution which is a variation on the above solution, utilizes a depletion mode MOSFET in place of the resistive load of the above arrangement, thus providing a high equivalent load resistance. However, power dissipation due to the resistance load is still higher than desired.

An article "Mosaic Focal Plane Methodologies" by Wong et al., Proceedings of the Society of Photo-Optical Instrumentation Engineers, Vol. 244, pp. 113-125 (1980) describes the use of Z-technology in fabricating mosaic sensor focal planes, Z-technology allowing increased signal processing integrated circuit area per detector channel. The article discloses a common gate reset transimpedance amplifier which band limits the noise of the detector and preamplifier and includes a synchronously clocked switched capacitor filter to achieve the desired function. As described in the article "MOS Switched-Capacitor Filters", Broderson et al., Proceedings of the IEEE, Vol. 67, No. 1, pp. 61-75 (January, 1979), the switched capacitor essentially functions as a resistor, the resistance value of which is related to the value of the switched capacitor and the switching frequency. Although this configuration performs satisfactorily, the detector voltage is not accurately controlled such that it is consistently maintained close to zero.

U.S. Pat. No. 4,100,407 to Takahashi discloses a circuit having a capacitor for comparing the output voltage of an operational amplifier, connected to a photosensor, with a reference voltage, and discharging means operable under the control of the capacitor to discharge the charge stored in a parasitic capacitor of the photosensor when the circuit is energized for operation; U.S. Pat. No. 4,320,347 to Hague discloses a switched capacitor employing an operational amplifier; and U.S. Pat. No. 3,988,689 to Ochi et al., U.S. Pat. No. 4,068,182 to Dingwall et al. and U.S. Pat. No. 4,255,715 to Cooperman disclose the use of switching capacitors. It should be noted that none of the patent references set forth hereinabove are concerned with providing a transresistance type amplifier which meet the design criteria set forth hereinabove.

SUMMARY OF THE INVENTION

The present invention provides an improved transresistance amplifier for use in low power circuit applications. The transresistance amplifier ("Tr amplifier") includes a gain stage in its feedback path which enables the input impedance of the Tr amplifier to be reduced, the gain stage including a switched capacitor load. An integrating capacitor is coupled across the output of the Tr amplifier. The gain stage and the Tr amplifier are each connected to a switch, the on-off conditions of which are under the control of an external switching signal. Input current to the Tr amplifier from a current source is integrated by the discharging of the integrating capacitor. At the end of the integration period the voltage across the capacitor is sampled which represents the amount of current input to the amplifier. The input current initially tends to make the input voltage rise, the voltage being amplified by the gain stage and being provided with an appropriate polarity to reduce the initial input voltage, thus lowering the current flowing through the Tr amplifier into the current source. This process continues in a regenerative manner until the input voltage is lowered to a small average value, thus lowering the input impedance of the Tr amplifier. Since the capacitor across the feedback amplifier is continuously being switched between two voltage levels, the input voltage does not reach a steady state value but varies throughout the switching cycle. The average input voltage is reduced, however, yielding the desired low input impedance load, the total transresistance of the Tr amplifier being related to the value of the integrating capacitor and the system switching frequency.

The present invention thus provides an effective technique for controlling the equivalent input impedance of a transresistance amplifier using switched capacitors and a gain stage in the feedback path of the transistor amplifier. In the specific adaptation wherein the transresistance amplifier is coupled to a photovoltaic detector, the input impedance (and voltage across the detector) is maintained at a low value thus substantially reducing the noise characteristics of the detector and increasing the system current injection efficiency.

The implementation of the above by utilizing a switched capacitor provides additional advantage. In particular, large values of resistance can be simulated using a component (capacitor) which can be easily implemented in monolithic form and which provides minimal power dissipation. Further, unlike discrete resistors, the simulated resistance is not affected by temperature variations. The use of a switched capacitor load in the feedback path also provides higher gain than that provided by the use of a MOSFET dynamic load.

The transresistance amplifier of the present invention is particularly useful in very low power (monolithic) applications employing MOSFET transistors operating in the sub-threshold region, and also operates well at cryogenic temperatures, making it an ideal monolithic photovoltaic detector amplifier.

BRIEF DESCRIPTION OF THE DRAWING

For a better understanding of the invention as well as other objects and further features thereof, reference is made to the following description which is to be read in conjunction with the accompanying drawing wherein.

DETAILED DESCRIPTION OF THE INVENTION

Figure 1:
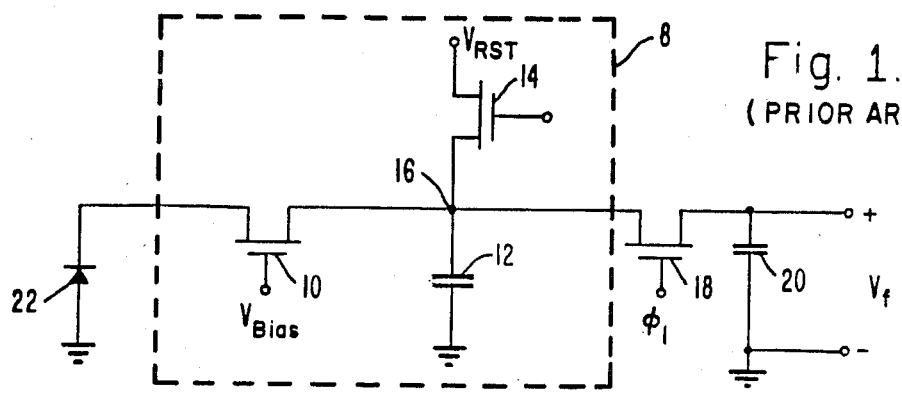
FIG. 1 is a prior art direct injection amplifier (transimpedance amplifier)

Referring now to FIG. 1, a prior art transresistance amplifier 8, referred to as either a direct injection or transimpedance amplifier, is illustrated. Amplifier 8 is a circuit based upon an enhancement mode n-MOS transistor 10 having a bias voltage, $V_{bias}$, applied to the gate electrode. It should be noted that p-MOS transistors with appropriate biasing could also be utilized. In both cases, the term MOSFET is generic. The drain electrode of transistor 10 is connected to node 16 to which are connected one terminal of capacitor 12 and the source electrode of enhancement mode n-MOS switching transistor 14. The other terminal of capacitor 12 is grounded. The drain electrode of a third enhancement mode n-MOS switching transistor 18 is also connected to node 16. The source electrode of switching transistor 18 is connected to one terminal of capacitor 20, the other capacitor terminal being grounded. A switching pulse signal $\phi_1$ is applied to the gate electrode of transistor 18 and a switching pulse signal $\phi_2$, having a pulse width typically of 100 $\mu$s, is applied to the gate electrode of transistor 14.

In the embodiment illustrated, amplifier 8 is connected to a photovoltaic detector 22. Typically, detector 22 is responsive to infrared radiation and may, for example, be incorporated in a signal processing chip which processes the outputs of, for example, thirty-two independent photovoltaic detectors. The current output of each detector is converted to a voltage by a plurality of amplifiers like amplifier 8, the outputs of which can be applied to a corresponding number of high pass filters to remove the stationary background information. The output of each filter, in turn, is connected to a multiplexer, and buffer, the output of which corresponds to the output of a selected detector.

As set forth hereinabove, photovoltaic detectors perform best in most infrared detection systems when operated in the current mode. In this mode, the detector is optimally biased near zero volts and the detector signal current is coupled and converted to a useful voltage by amplifier 8. As explained hereinafter with reference to FIG. 3, a switched capacitor arrangement comprising capacitor 12, transistor 14, reset supply voltage $V_{rst}$ and switching signal $\phi_2$, operate in a manner such that an effective resistance, having a value equal to $1/C_{12}f_{\phi 2}$, wherein $C_{12}$ is the capacitance value of capacitor 12 and $f_{\phi 2}$ is the switching frequency, loads transistor 10. The components used in this equivalent resistive load implementation can be fabricated in monolithic form on a small chip area with reduced power dissipation.

Switching signal $\phi_1$ enables the voltage stored on capacitor 12 to be sampled and stored in capacitor 20 as $V_f$ for eventual readout by circuitry external to the signal processing chip. After sampling, signal $\phi_1$ causes transistor 18 to be switched off and switching signal $\phi_2$, a predetermined time period thereafter, switches transistor 14 on, effectively resetting capacitor 12 for the next integration period.

Figure 2:
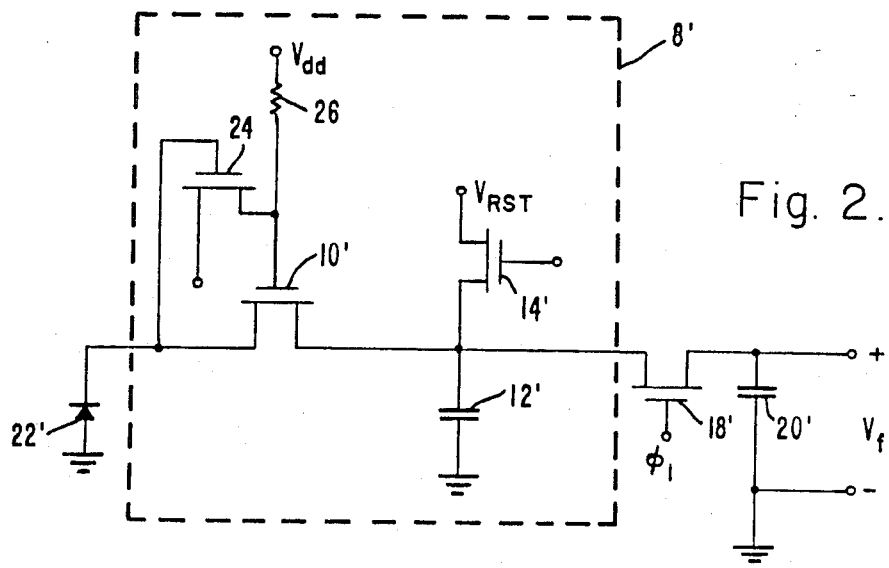
FIG. 2 is an improvement over the device shown in FIG. 1 and utilizes a gain stage in the gate circuit.

FIG. 2 improves upon the amplifier 8 shown in FIG. 1 by providing a gain stage in the gate circuit of transistor 10. It should be noted that primed reference numerals refer to corresponding components in each of the figures. In particular, a MOSFET transistor 24 is utilized as the gain stage and is coupled between the gate electrode of transistor 10 and detector 22, as illustrated. A resistance 26 is included in the load circuit of transistor 24. Although the transresistance amplifer 8' shown in FIG. 2 has a reduced input impedance as compared with amplifier 8 (FIG. 1) and thus has improved noise characteristics, MOSFET transistor 24 is typically operated in the above threshold region to achieve a gain (usually low) resulting in a relatively large power dissipation. Further, to increase the gain, larger chip areas than desired are required.

Figure 3:
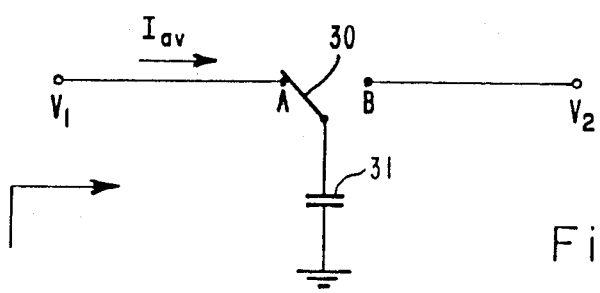
FIG. 3 illustrates the theory of switched capacitor operation.

FIG. 3 explains, in simplified form, the concept of a switched capacitor resistor. A capacitor 31 of capacitance C has one terminal grounded and the other terminal connected to a switch arm 30 which is switched between nodes A and B at a frequency $f_s$. A source of voltage $V_1$ is connected to node A and a source of voltage $V_2$ is connected to node B. An average current I flows to capacitor 31, the magnitude thereof given by $$I_{av} = qf_s \tag{1}$$
$$= Cf_s(V_1 - V_2) \tag{2}$$

wherein q is the charge collected on the capacitor plates. Equation (2) can be rewritten as:

$$I_{av}R_{eq} = V_1 - V_2 \tag{3}$$
$$\text{where } R_{eq} = \frac{1}{Cf_s} \tag{4}$$

wherein $R_{eq}$ is the equivalent resistance value. It should be noted that switched capacitor resistors behave as resistors only until the signal frequency approaches one-half of the switching frequency $f_s$. Thus, for a typical switching frequency of 5.0 Hz signal frequencies of up to 2.5 Hz are of interest.

Figure 4:
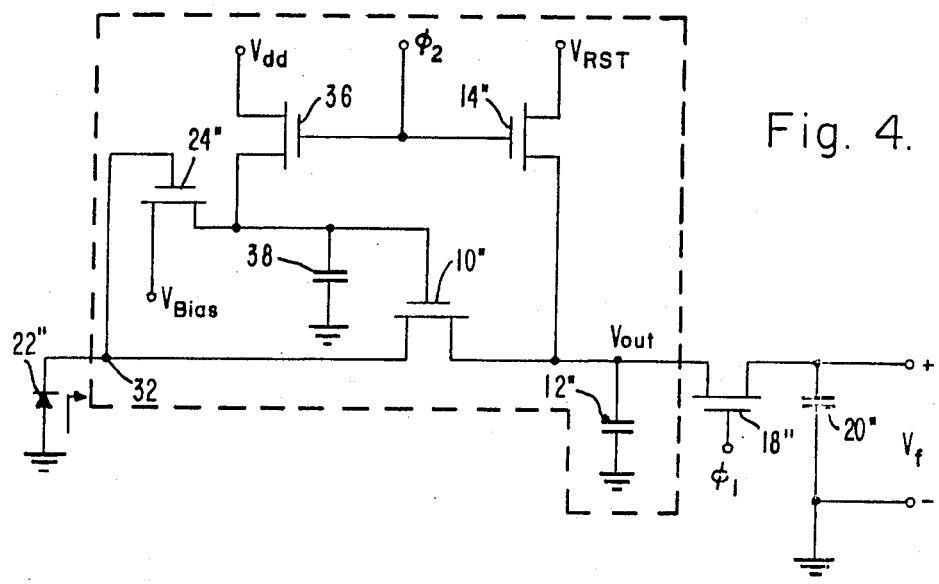
FIG. 4 is a schematic diagram of a transresistance amplifier in accordance with the teachings of the present invention.

Referring now to FIG. 4, the transresistance amplifier 8" of the present invention is shown. The drain electrode of a MOSFET transistor 10" is connected to the source electrode of a MOSFET switching transistor 14" and the source electrode thereof is coupled to node 32. Both the cathode terminal of detector 22" and the gate electrode of a MOSFET transistor 24" are connected to node 32. The source electrode of transistor 24" is connected to bias voltage source $V_{bias}$ and the drain electrode thereof is connected both to the source electrode of a second MOSFET switching transistor 36 and to one terminal of capacitor 38, the other terminal of which is at ground. A timing signal $\phi_2(t)$ supplied typically by a source external to amplifier 8" and having a repetition frequency $f_s$ (FIG. 7(a)), is connected to the gate electrode of MOSFET transistors 14 and 36. It should be noted that FET devices, other than MOSFET transistors could be utilized as the amplifiers and-/or switches. The remaining components of the circuit are connected as shown, in a manner similar to the corresponding components in FIGS. 1 and 2.

Figure 5:
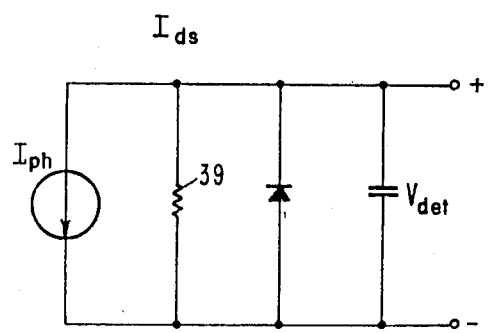
FIG. 5 is an equivalent circuit of a photovoltaic detector utilized with the transresistance amplifier of the present invention.

Prior to going into the description of the circuit operation, a review of the characteristics of a typical photovoltaic detector and the current characteristics of a typical MOSFET transistor would be instructive. FIG. 5 represents an ideal model for detector 22". At a given bias, the detector current $I_{det}$ is proportional to the incident light flux. To reduce noise it is desirable to operate the detector into a short circuit load (voltage across the detector, $V_{det} = 0$). This is difficult to achieve in practice because of chip area and power considerations. Operational amplifiers have very high input impedance and require a large chip area whereas bipolar transistors operate poorly under low temperature/low current conditions.

Thus, it would be desirable to have a circuit design that operates the detector at a relatively low $V_{det}$ that remains essentially constant for a wide change in light flux, has relatively low power dissipation and does not require a large chip area. These advantageous characteristics are provided by the present invention. In essence, the current $I_{det}$ (or $I_{ds}$) into the detector is maintained at a low average value over the switching cycle such that $I_{det}$ closely approximates $I_{ph}$, thus reducing the voltage across $R_r$, 39, (and thus $V_{det}$) towards zero.

Figure 6:
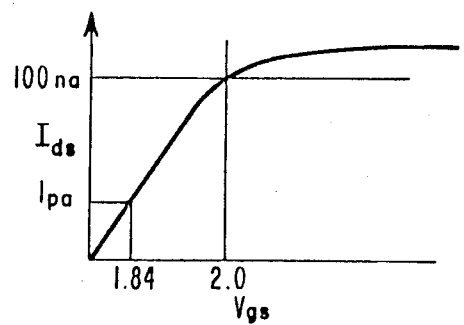
FIG. 6 is a graphical representation of the threshold and sub-threshold operating characteristics of a typical MOSFET.

FIG. 6 is a graph which shows a typical MOSFET transistor current characteristic and illustrates how current varies in response to $V_{gs}$ (the voltage between the gate and source electrode), the current $I_{ds}$ being plotted as a logarithm function. Above the threshold voltage $V_t$, typically 2.0 Vdc, current varies relatively slowly with increased values of $V_{gs}$. Below the threshold voltage (the sub-threshold range is highly non-linear) current decreases very rapidly for small changes in voltage. For example, if the transistor is operating at $V_t$ (here, 2.0 Vdc), $I_{ds}$ typically has a value in the range of $100_{na}$. If $V_g$ is slightly decreased to 1.84 Vdc for example, $I_{ds}$ typically falls to a value of 1 pa. Thus, for a slight change in voltge, the current changes rapidly.

Figure 7:
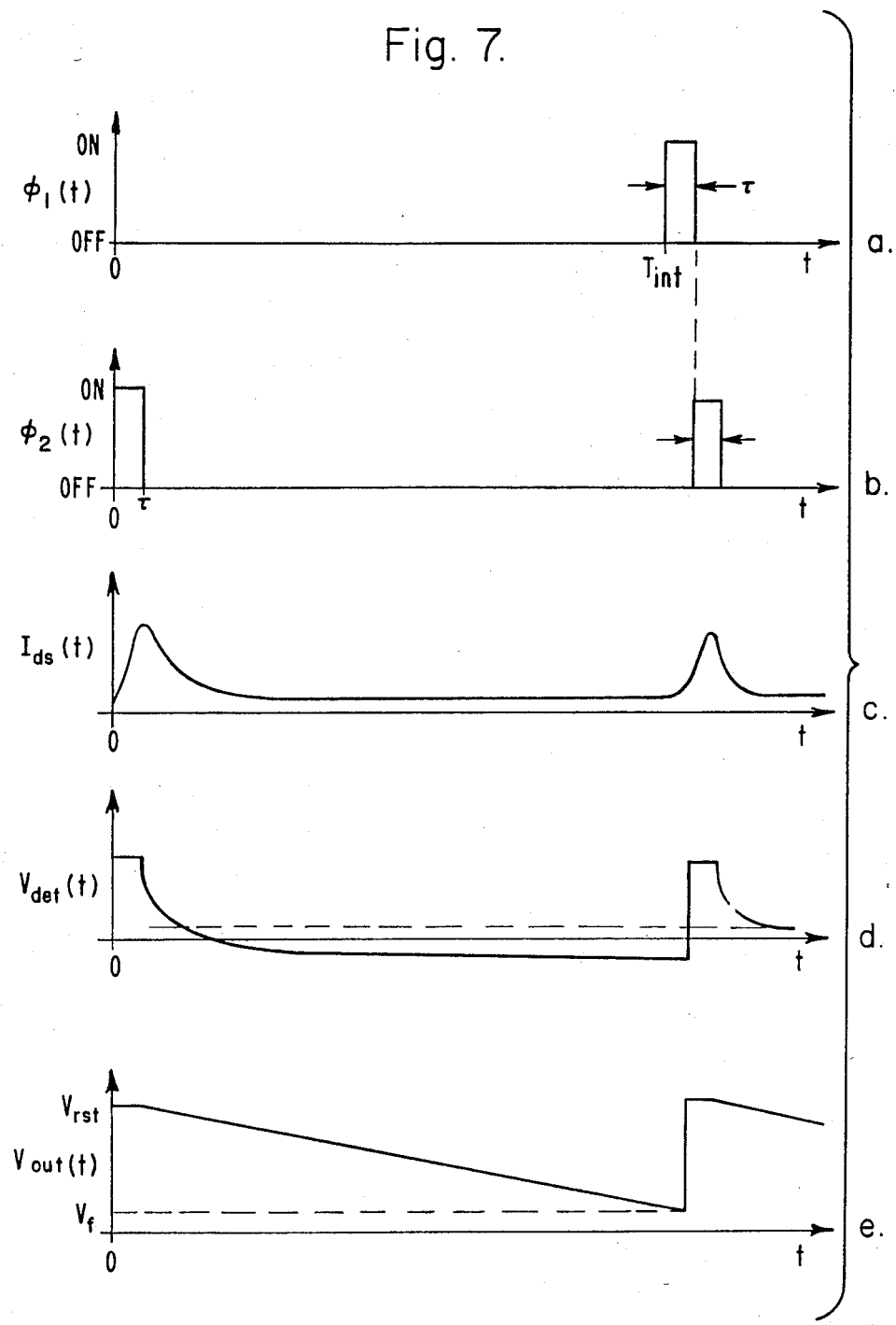
FIGS. 7(a)–7(e) are graphical representations of waveforms associated with the amplifier shown in FIG. 4.

Returning to the operation of the circuit shown in FIG. 4, reference should be now be made additionally to FIGS. 7(a) through (e). FIG. 7(a) is a plot of $\phi_1(t)$ with time, while FIG. 7(b) is a plot of $\phi_2(t)$ with time, FIG. 7(c) is a plot of $I_{ds}(t)$ with time, FIG. 7(d) is a plot of $V_{det}$ with time, and FIG. 7(e) is a plot of $V_{out}(t)$ with time. The time axes of FIGS. 7(a) through (e) align vertically to aid in illustration.

MOSFET transistors 14" and 36 function as switches under the control of $\phi_2(t)$. Initially, $\phi_2(t)$ causes both transistors 14" and 36 to be on for a short period $\tau$ (FIG. 7(a)) charging capacitor 12" to $V_{rst}$ (FIG. 7(d)), typically 10 Vdc, and charging capacitor 38 to $V_{dd}$, typically 3 Vdc.

At time $\tau$, MOSFETs 14" and 36 are switched off. The 3 Vdc appearing at the gate of MOSFET transistor 10" is above the threshold value of 2 Vdc (it is assumed that MOSFET transistors have a 2 Vdc threshold value), causing a large current, $I_{ds}$ (FIG. 7(b)), to flow through transistor 10". The current flowing through detector 22" initially tends to make the detector voltage, $V_{det}$ (FIG. 7(c)), rise and effectively mask the photovoltaic current $I_{ph}$. The detector current is integrated by discharging capacitor 12" through transistor 10". The rise in detector voltage $V_{det}$ (to approximately 1 Vdc) appears at the gate of transistor 24". The resulting increased gate to source voltage of transistor 24", typically 3 Vdc (assuming a $V_{bias}$ of $-2$ Vdc), causes a large current to flow through transistor 24" from capacitor 38. This in turn decreases $V_g$ from an initial value of 3 Vdc, which decreases $I_{ds}$ (FIG. 7(b)), further reducing $V_{det}$ towards zero (FIG. 7(c)). The decreased value of $V_{det}$ in turn causes a decreased current flow in transistor 24", further reducing the voltage across capacitor 38. The process continues due to the negative feedback connection of MOSFET transistor 24" with the current in transistor 24" being reduced to a low value and the voltage across capacitor 38 stabilizing at some value ($\sim 1.90$ volts) near the threshold of transistor 10". $I_{ds}$ in turn stabilizes at a value close to $I_{ph}$ ($I_{ph}$ is essentially constant due to the constant radiation). $V_{det}$ thus being reduced to an average value close to zero (i.e., within a few millivolts as shown in FIG. 7(c), such that detector noise is minimized. It should be noted that with $V_{det}$ close to or equal to zero, $I_{ph}$ is substantially the only current flowing into the source of transistor 10″, thus providing an accurate measure of the detected radiation. The entire process described occurs very rapidly.

At the end of the integration period ($T_{int}$), which is sufficient to allow $I_{ds}$ to reach a value aproximating $I_{ph}$, the output voltage level $V_{out}$ (FIG. 7(d)) across capacitor 12″ is sampled by $\phi_1(t)$ switching on transistor 18″ (FIG. 7(a)). Capacitor 20″ thereby provides an output $V_f$ representing the detected radiation. Capacitor 12″ is then reset to $V_{rst}$. It should be noted that $V_g$ (and $V_{det}$) does not reach a steady state value and varies throughout the switching cycle. However, the average detector voltage is reduced which yields the desired low input impedance $Z_{in}$.

As set forth hereinabove, the voltage on the drain of transistor 24″, after capacitor 38 has been charged to $V_{dd}$, rapidly decays toward $V_{bias}$. However, this in turn causes the voltage across detector 22″ to drop and consequently the drain current of transistor 24″ decreases, the drain voltage of transistor 24″ at a constant voltage greater than $V_{bias}$ (typically, $V_{bias}$ is on the order of $-2$ Vdc). This results in a detector voltage of approximately zero volts if $V_{bias}$ is chosen correctly. The decay, due to the MOSFET characteristics shown in FIG. 6, proceeds rapidly so that over most of the switching cycle $V_{det}$ is approximately zero.

Since $V_{det}$, on the average, has a reduced value, $Z_{in}$, the equivalent input impedance to tranresistance amplifier 8″ also has a reduced value as compared with the input impedance of prior art transresistance amplifiers. With $R_{in}$ considerably less than $R_{det}$, the injection efficiency, $n_{eff}$, is very high. In other words, substantially all of $I_{ph}$ flows into transresistance amplifier 8″. The gain provided by the gain stage (transistor 24″) and its associated switched capacitor 38 thus results both in $V_{det}$ being reduced towards zero and in an increase in $n_{eff}$. The actual value of gain is not critical since the primary function of the above-described transresistance amplifier is to provide an accurate measurement of $I_{ph}$.

It has been determined that the total transresistance $R_t$ (FIG. 4) of amplifier 29 is approximately $1/f_s C_{12}$ wherein $f_s$ is the switching frequency of signal $\phi_2(t)$, typically 5.0 Hz, and $C_{12}$ is the capacitance value for $R_t$ of 20 Gohms. Thus, $R_t$ can be chip tuned to provide a desired change in $V_o$ for a given change in $I_{ph}$.

Typical component types and values for a monolithic version of the schematic circuit shown in FIG. 4 have been determined to be as follows:

$V_{rst} = 10\ Vdc$
$V_{dd} = 3\ Vdc$ $\phi_1(t),\ \phi_2(t): f_0 = \dfrac{1}{T_{int}} = 5.0\ Hz$ $\tau = 100\ \mu s$
On level $\approx$ 20 V
Off level $\approx$ 0 V
$C_{38} = 2.5\ pf$
$C_{12} = 10\ pf$
$C_{20} = 2.5\ pf$ Detector—HgCdTe type manufactured by Santa Barbara Research Center, Goleta, Calif.

A scaled version of the circuit shown in FIG. 4 using discrete active components, and having a polarity reverse of the circuit shown in FIG. 4 (p-channel MOS-FETs were used rather than n-channel MOSFETs), was successfully tested at 77° K. The component types and values in this circuit were as follows:

$V_{rst} = -3.90\ Vdc$
$V_{dd} = -10.0\ Vdc$
$V_{bias} = +3.38\ Vdc$
$\phi_1(t),\ \phi_2(t): f_0 = 50\ Hz$
$\tau = 10\ \mu s$
On level $\approx -20$ v
Off level $\approx 0$ v
$C_{38} = 24\ pf$
$C_{12} = 93.1\ pf$
$C_{20} = 24\ pf$ All discrete MOSFETs were type 3N163 manufactured by Siliconix Incorporated, Santa Clara, Calif.

A 200 MΩ resistor was substituted for the detector for this test.

The present invention thus provides a transresistance amplifier which is a significant improvement over the prior art. By using switched capacitor resistances in the output load and in the gain stage instead of discrete resistors, implementation in monolithic form with much lower power dissipation on a smaller chip area can be easily achieved. Further, the specific arrangement of components in the amplifier allow MOSFET transistor current to be controlled accurately and rapidly, decreasing from a relatively high value to a low value very rapidly. This feature is particularly useful when converting the current output from a photovoltaic detector to a voltage while maintaining the average detector voltage close to zero, thus minimizing certain types of detector noise. Reducing the detector voltage to approximately zero also substantially reduces the effective input impedance of the amplifier thus increasing the injection efficiency of the amplifier. Further, utilizing switched capacitor resistor as the output load enables the total transresistance of the amplifier to be set to a desired value by simply tuning the switched capacitor value until the desired value of transistance is attained.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. A transresistance amplifier for measuring the amount of current flowing to a photovoltaic detector such that the average voltage across said detector is maintained at a value to minimize the electrical noise associated with said detector comprising:
   a first MOSFET amplifier having a gate electrode and drain and source terminals;
   a first MOSFET switch coupled to the drain terminal of said first MOSFET amplifier;
   a first capacitor coupled to the drain terminal of said first amplifier, a switching signal of frequency $f_s$ being coupled to said first switch for enabling a first source of voltage to be connected to said first capacitor for a first portion of said switching signal frequency cycle, the voltage across said first capacitor during the remaining portion of said cycle representing the current flowing to said detector through said first amplifier;

a second MOSFET amplifier having a gate electrode and drain and source terminals, the drain terminal of said second amplifier being connected to the gate electrode of said first amplifier, the gate electrode of said second amplifier being connected to said detector;

a second MOSFET switch coupled to the drain terminal of said second amplifier; and a second capacitor coupled to the output of said second amplifier, said switching signal being coupled to said second switch means for enabling a second source of voltage to be connected to said second capacitor for said first portion of said switching signal frequency cycle, the current flowing through said first amplifier being controlled in a manner such that the average current over a cycle of said switching frequency is of a value to maintain the average value of said detector voltage at said noise minimization value.

2. The transresistance amplifier of claim 1 wherein said transresistance amplifier is maintained at a temperature of approximately 77° K.

3. The transresistance amplifier of claim 1 wherein said first and second MOSFET amplifiers are operated above their threshold values during said first portion of said switching cycle and in the sub-threshold region during the remaining portion of said switching cycle.

4. The transresistance amplifier of claim 1 further including a capacitor and switch arrangement for sampling and storing the voltage across said first capacitor at a time when said sampled voltage represents the current generated by said detector in response to radiation incident thereon.

5. The transresistance amplifier of claim 1 wherein said second switch, said second capacitor and switching signal in combination function as a resistive load for said second amplifier.

6. The transresistance amplifier of claim 5 wherein the value of said resistive load is related to the capacitance value of said second capacitor and said switching frequency $f_s$.

7. The transresistance amplifier of claim 1 wherein the equivalent input impedance of said transresistance amplifier is at least an order of magnitude less than the impedance of said detector.

8. The transresistance amplifier of claim 1 wherein the total transresistance thereof is related to the capacitance value of said first capacitor and said switching freqency $f_s$.

9. The transresistance amplifier of claim 1 wherein said current flowing through said first amplifier rises during said first portion of said cycle then rapidly decreases to a value which causes the voltage across said detector to be reduced to approximately zero.

* * * * *